(12) United States Patent
Silberberg et al.

(10) Patent No.: US 11,492,695 B2
(45) Date of Patent: Nov. 8, 2022

(54) VACUUM DEPOSITION FACILITY AND METHOD FOR COATING A SUBSTRATE

(71) Applicant: ArcelorMittal, Luxembourg (LU)

(72) Inventors: Eric Silberberg, Haltinne (BE); Sergio Pace, Jodoigne (BE); Remy Bonnemann, Saint-Nicolas (BE)

(73) Assignee: ArcelorMittal, Luxembourg (LU)

( * ) Notice: Subject to any disclaimer, the term of this patent is extended or adjusted under 35 U.S.C. 154(b) by 0 days.

(21) Appl. No.: 15/734,911

(22) PCT Filed: Apr. 23, 2019

(86) PCT No.: PCT/IB2019/053339
§ 371 (c)(1),
(2) Date: Dec. 3, 2020

(87) PCT Pub. No.: WO2019/239228
PCT Pub. Date: Dec. 19, 2019

(65) Prior Publication Data
US 2021/0230736 A1    Jul. 29, 2021

(30) Foreign Application Priority Data
Jun. 13, 2018  (WO) .................. PCT/IB2018/054299

(51) Int. Cl.
*C23C 14/16* (2006.01)
*C23C 14/04* (2006.01)
(Continued)

(52) U.S. Cl.
CPC .............. *C23C 14/16* (2013.01); *C23C 14/04* (2013.01); *C23C 14/24* (2013.01); *C23C 14/562* (2013.01); *C23C 16/06* (2013.01)

(58) Field of Classification Search
CPC ......... C23C 16/06; C23C 14/14; C23C 14/16; C23C 14/24; C23C 14/56; C23C 14/243; C23C 16/00; C23C 16/0623; C23C 14/562
See application file for complete search history.

(56) References Cited

U.S. PATENT DOCUMENTS 5,803,976 A * 9/1998 Baxter .................. C23C 14/243
                                                        118/726
6,202,591 B1    3/2001 Witzman et al.
(Continued)

FOREIGN PATENT DOCUMENTS

DE    10 2013206598 A1    10/2014
EP         0909342 B1     8/2004
(Continued)

OTHER PUBLICATIONS

International Search Report of PCT/IB2019/053339, dated Aug. 26, 2019.

*Primary Examiner* — Tabassom Tadayyon Eslami
(74) *Attorney, Agent, or Firm* — Davidson, Davidson & Kappel, LLC

(57) ABSTRACT

A Method for continuously depositing, on a running substrate, coatings formed from at least one metal inside a vacuum deposition facility including a vacuum chamber; a substrate coated with at least one metal on both sides of the substrate having an average thickness, wherein the coating is deposited homogenously such that the maximum thickness of the coating can exceed the average thickness of 15% maximum. A vacuum deposition facility also is provided.

13 Claims, 4 Drawing Sheets

(51) Int. Cl.
   *C23C 14/24* (2006.01)
   *C23C 14/56* (2006.01)
   *C23C 16/06* (2006.01)

(56) References Cited

U.S. PATENT DOCUMENTS

| | | | |
|---|---|---|---|
| 8,481,120 B2 | 7/2013 | Choquet et al. | |
| 9,045,819 B2 | 6/2015 | Honda et al. | |
| 2008/0245300 A1* | 10/2008 | Kuper | C23C 14/24 |
| | | | 118/724 |
| 2010/0104752 A1 | 4/2010 | Choquet et al. | |
| 2011/0000431 A1* | 1/2011 | Banaszak | C23C 14/243 |
| | | | 118/694 |
| 2011/0281031 A1 | 11/2011 | Silberberg et al. | |
| 2012/0070928 A1 | 3/2012 | Kim et al. | |

FOREIGN PATENT DOCUMENTS

| | | |
|---|---|---|
| EP | 1 972699 A1 | 9/2008 |
| EP | 2048261 | 4/2009 |
| EP | 2129811 B1 | 8/2013 |
| EP | 2940191 | 11/2015 |
| JP | S 6296669 A | 5/1987 |
| JP | S6326351 | 2/1988 |
| JP | H024963 A | 1/1990 |
| JP | H06136537 A | 5/1994 |
| JP | H06212424 A | 8/1994 |
| JP | 2004311065 A | 11/2004 |
| JP | 2007/262540 * | 10/2007 |
| JP | 2007262540 | 10/2007 |
| JP | 2010522272 A | 7/2010 |
| JP | 2011503344 A | 1/2011 |
| JP | 2012512959 A | 6/2012 |
| JP | 2013-506761 A | 2/2013 |
| JP | 2014132102 A | 7/2014 |
| WO | WO97/47782 | 12/1997 |
| WO | WO2008/064894 | 6/2008 |
| WO | WO2010067603 A1 | 6/2010 |
| WO | WO 2019/239227 A1 | 12/2019 |
| WO | WO 2019/239229 A1 | 12/2019 |

* cited by examiner

VACUUM DEPOSITION FACILITY AND METHOD FOR COATING A SUBSTRATE

The present invention relates to a method for continuously depositing, on a substrate, coatings formed from metal or metal alloys. The present invention also relates to a vacuum deposition facility used in this method.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 a method for the continuous coating of a steel substrate in which a metallic vapor spray, propelled at a speed greater than 500 m/s, comes in contact with the substrate. The deposition method is called jet vapor deposition.

EP2048261 discloses a vapor generator for depositing a coating on a metallic substrate, and comprises a vacuum chamber in the form of an enclosure provided with a unit to ensure a state of depression with respect to the external environment and a unit allowing entry and exit of the substrate. The enclosure comprises a head for vapor deposition, and an ejector for creating a metal vapor jet at the sonic speed in the direction of and perpendicular to the substrate surface. The ejector is sealably connected with a crucible by a supply pipe. The crucible contains a mixture of metals in liquid form, and is located outside the vacuum chamber and fed by pumping or by barometric effect of the melt obtained from a melting furnace placed at atmospheric pressure. A unit is arranged to regulate flow, pressure and/or speed of the metal vapor in the ejector. The regulation unit comprises a butterfly type proportional valve and/or a pressure drop device arranged in the pipe. The ejector comprises a longitudinal slit as sonic collar for vapor exit extending on the whole width of the substrate, and a sintered filter medium or a pressure loss body for standardizing and correcting the velocity of the vapor exiting from the ejector.

In EP2048261, preferably, the generator comprises a means for adjusting the length of the longitudinal slit of the ejector to the width of the substrate. In particular, a simple system for adjusting the vapor jet slot to the width of the strip by rotation of the ejector around its axis is disclosed. Thus, the edges of the vapor jet and the edges of the substrate are in same plans, i.e. the distances between edges of the vapor jet and the edges of the substrate are equal to 0 mm. The generator can comprise two ejectors located on both side of the metallic substrate.

SUMMARY OF THE INVENTION

Nevertheless, by using such generator, there is a risk that during the deposition process, metal vapors are heterogeneously deposited on the metallic substrate. Indeed, it has been observed that the vapors tend also to accumulate in some areas of the metallic substrate for example on the edges of the substrate.

It is an object of the present invention to provide a method for depositing coatings on a running substrate wherein metal vapors are homogenously deposited on both sides of the metallic substrate.

The present invention provides a method for continuously depositing, on a running substrate, coatings formed from at least one metal inside a vacuum deposition facility comprising a vacuum chamber, wherein the method comprises:

a step in which in the said vacuum chamber, a metallic vapor is ejected through at least two vapor ejectors (3, 3'), towards both sides of the running substrate and a layer of at least one metal is formed on each side by condensation of ejected vapors, the at least two vapor ejectors facing each other being located on both sides of the substrate and being positioned respectively with an angle $\alpha$ and $\alpha'$, being between the vapor ejector and the axis (A) perpendicular to the running direction of the substrate, the axis being in the plane of the substrate, $\alpha$ and $\alpha'$ both satisfying the following equations:

$(D1+D2)+Le \sin \alpha + We \cos \alpha = Ws$ and $(D1+D2)+Le \sin \alpha' + We \cos \alpha' = Ws$ $\alpha$ and $\alpha'$ a in absolute value being above 0° and D1 and D2 being the lower distance between ejectors and each substrate edge along the axis (A), Ws being the substrate width, D1 and D2 being above 0 mm, i.e. the ejector edges do not go beyond the substrate edges, and said vapor ejectors having an elongated shape and comprising a slot and being defined by a slot length Le and a slot width We, said vapor ejectors having the same rotation axis.

The invention also covers a coated substrate.
The invention also covers a vacuum facility.

BRIEF DESCRIPTION OF THE DRAWINGS

To illustrate the invention, various embodiments and trials of non-limiting examples will be described, particularly with reference to the following Figure.

DETAILED DESCRIPTION

Other characteristics and advantages of the invention will become apparent from the following detailed description of the invention.

The invention relates to a method for continuously depositing, on a running substrate, coatings formed from at least one metal inside a Vacuum deposition facility, wherein the method comprises:

a step in which in the said vacuum chamber, a metallic vapor is ejected through at least two vapor ejectors, towards both side of the running substrate and a layer of at least one metal is formed on each side by condensation of ejected vapors, the at least two vapor ejectors facing each other being located on both sides of the substrate and being positioned respectively with an angle $\alpha$ and $\alpha'$, being between the vapor ejector and the axis A perpendicular to the running direction of the substrate, the axis being in the plane of the substrate, α and α' both satisfying the following equation:

$$(D1+D2)+Le \sin α+We \cos α=Ws, \text{ and}$$

$$(D1+D2)+Le \sin α'+We \cos α'=Ws$$

α and α' a in absolute value being above 0° and D1 and D2 being the lower distance between ejectors and each substrate edge along the axis (A), Ws being the substrate width, D1 and D2 being above 0 mm and said vapor ejectors having an elongated shape and comprising a slot and being defined by a slot length Le and a slot width We, said vapor ejectors having the same rotation axis.

Without willing to be bound by any theory, it is believed that with the method according to the present invention, it is possible to obtain a coating having a homogeneous thickness. Indeed, the inventors have found that the at least two vapor ejectors have to be positioned respectively with a specific angle α and α' so that metal vapors are ejected almost without any lost. When a and α' satisfy the equation, the trajectory of the ejected metal vapor is well controlled to be deposited in the entire surface of both sides of the metallic substrate. Thus, the yield of the metal vapor deposited is highly improved. Moreover, the metal vapor is homogenously deposited on both sides of the running substrate leading to a coating having a constant thickness.

Figure 1:
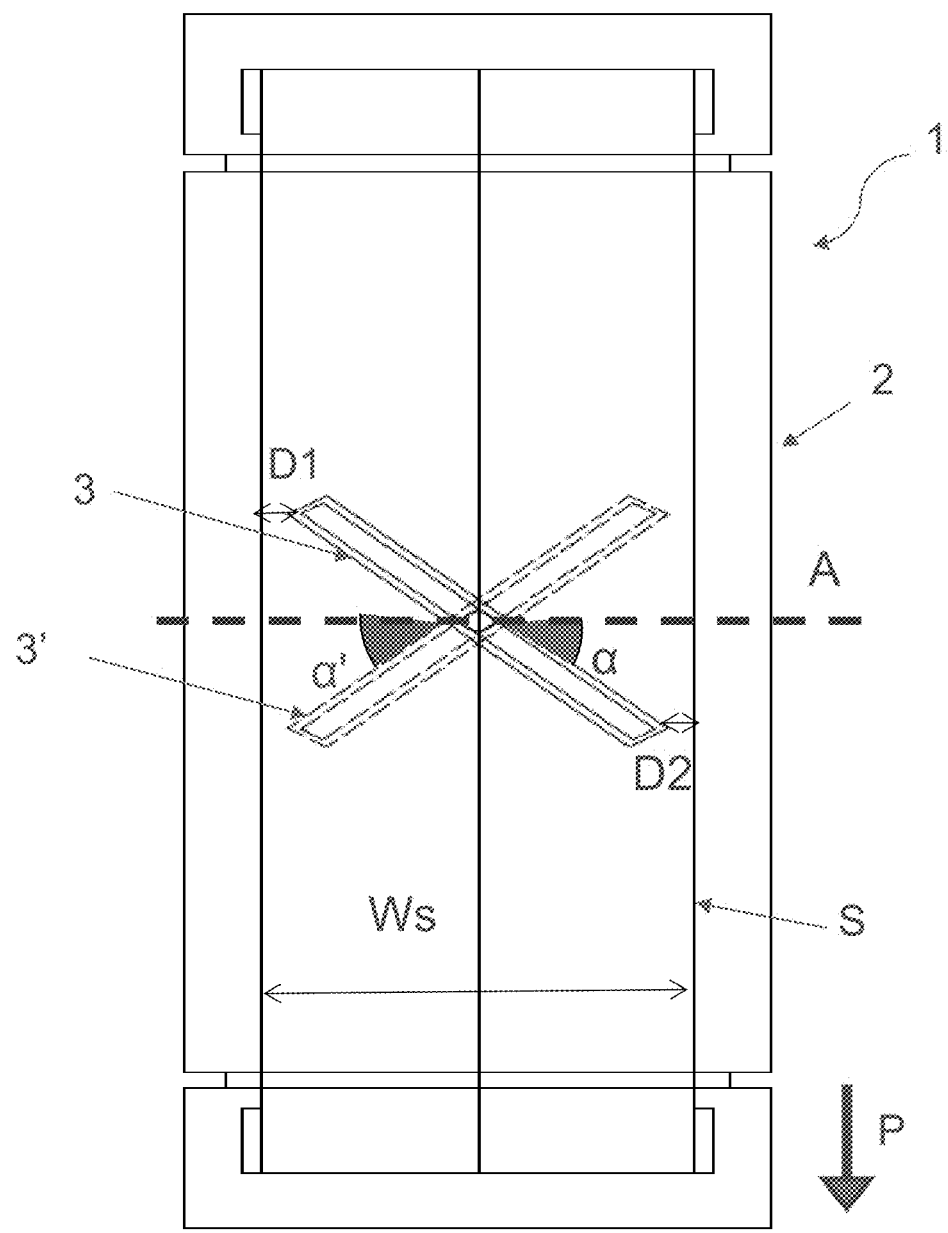
FIG. 1 illustrates a top view of a substrate coated with two vapor ejectors inside a vacuum deposition facility according to the present invention.

With reference to FIG. 1, the facility 1 according to the invention first comprises a vacuum chamber 2 and a means for running the substrate through the chamber. This vacuum chamber 2 is a hermetically-sealable box preferably kept at a pressure of between $10^{-8}$ and $10^{-3}$ bar. It has an entry lock and an exit lock (these not being shown) between which a substrate S, such as for example a steel strip, can run along a given path P in a running direction.

The at least two vapor ejectors 3, 3' eject metallic vapors at sonic speed on both sides of the running substrate. Both vapor ejectors are positioned respectively with an angle α and α' between the vapor ejector and the axis A perpendicular to the running direction of the substrate, the axis being in the plane of the substrate, α and α' both satisfying the following equations:

$$(D1+D2)+Le \sin α+We \cos α=Ws, \text{ and}$$

$$(D1+D2)+Le \sin α'+We \cos α'=Ws.$$

The vapor ejectors can have different shapes, such as a rectangular shape or trapezoidal shape. Different distances values of D1 and D2 are possible as illustrated in FIG. 1. Preferably, D1 and D2 represent the lowest distance between the ejector edges and the substrate edges along the axis A.

Figure 2:
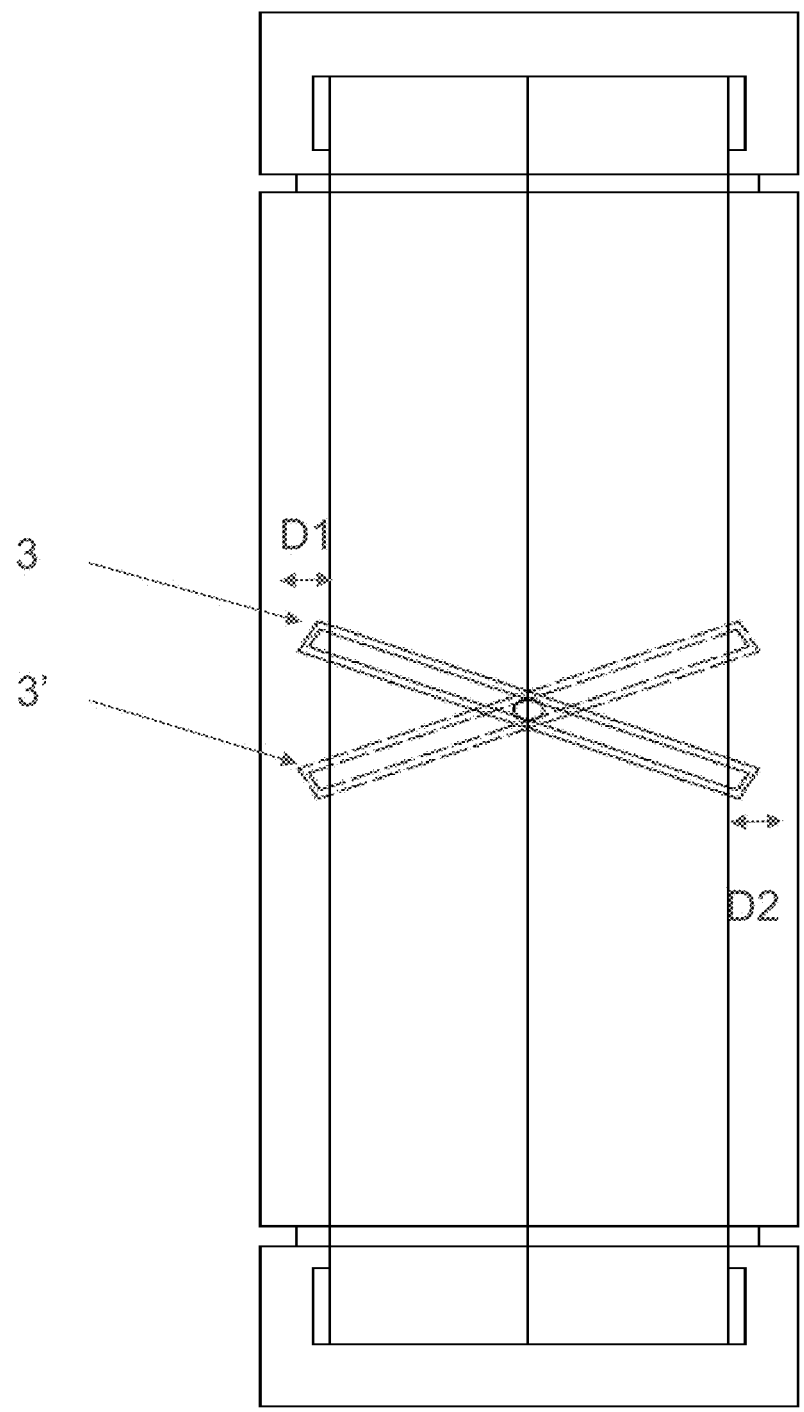
FIG. 2 illustrates a top view of a substrate coated with two vapor ejectors inside a vacuum deposition facility according to the prior art.

According to the present invention, D1 and D2 are above 0 mm, i.e. the ejector edges do not go beyond the substrate edges. Without willing to be bound by any theory, it is believed that if D1 and D2 are equal or below to 0 mm, there is a risk that the trajectory of the metallic vapor ejected through the vapor ejectors is not controlled leading to heterogeneous coating deposition. When D1 and D2 are below zero, it means that the edges of the vapor ejector extend beyond the substrate edges as illustrated in FIG. 2.

Preferably, D1 and D2 are independently from each other and above 1 mm, advantageously between 5 and 100 mm and more preferably between 30 and 70 mm.

In a preferred embodiment, D1 is identical to D2.

Preferably, the length of the ejector slot Le is between 5 and 50 mm.

Preferably, the substrate width Ws is maximum of 2200 mm. Advantageously, Ws is minimum of 200 mm. For example, Ws is between 1000 and 1500 mm.

Preferably, We is maximum of 2400 mm. Advantageously, We is minimum of 400 mm.

In a preferred embodiment, Ws is smaller or equal to We.

Preferably, α' is such that α-α'<10°, more preferably α-α'<5° and advantageously, α-α'<3° in absolute terms. For example, α-α' are equal to 0°.

Preferably, α is between 5 and 80°, advantageously between 20 and 60° in absolute terms and for example between 35 and 55° in absolute terms.

The vacuum chamber can comprise three or several vapor ejectors positioned on both sides of the running substrate. For example, the vacuum chamber can comprise two vapor ejectors positioned on each side of the metallic substrate.

Figure 3:
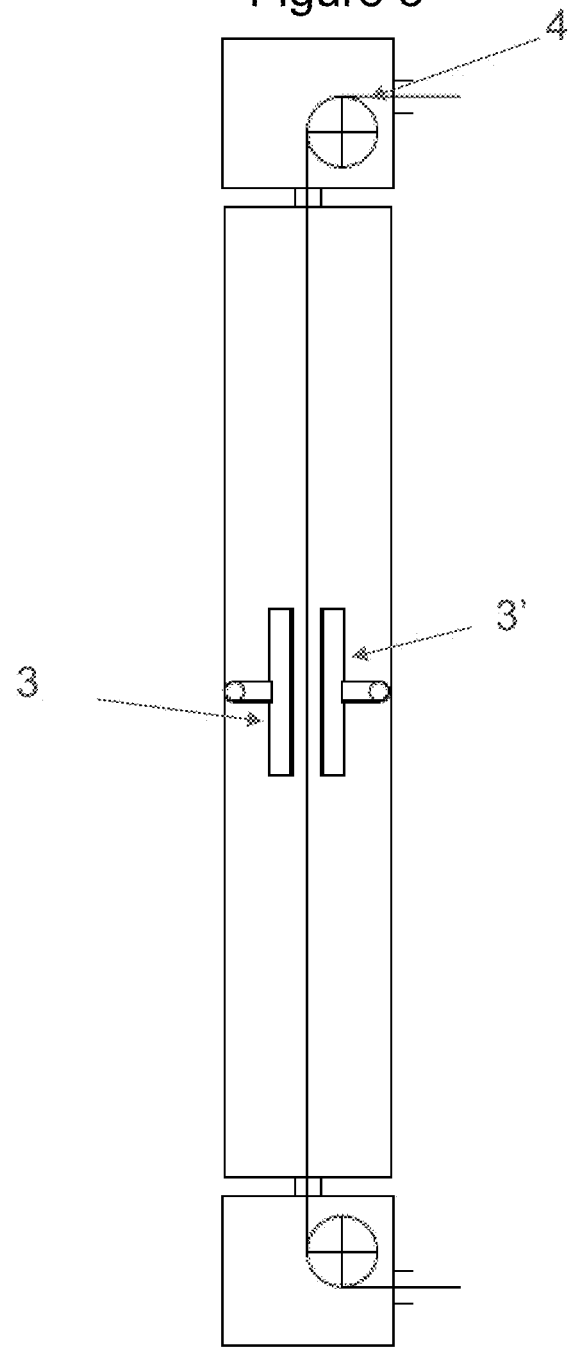
FIG. 3 illustrates a side view of a substrate coated with two vapor ejectors inside a vacuum deposition facility according to the present invention.

As illustrated in FIG. 3, the substrate S may be made to run by any suitable means, depending on the nature and the shape of said substrate. A rotary support roller 4 on which a steel strip can bear may in particular be used.

Figure 4:
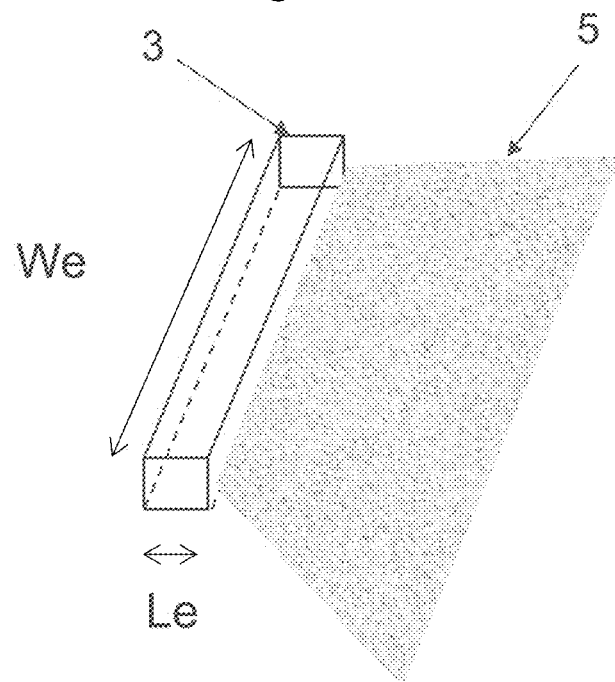
FIG. 4 illustrates an example of a vapor ejector ejecting a metallic vapor according to the present invention.

With reference to FIG. 4, the two vapor ejectors 3, 3' according to the present invention ejects a metallic vapor jet 5 at sonic speed on the running substrate. The at least two vapor ejectors have an elongated shape and comprises a slot and is defined by a slot length Le, a slot width We.

Figure 5:
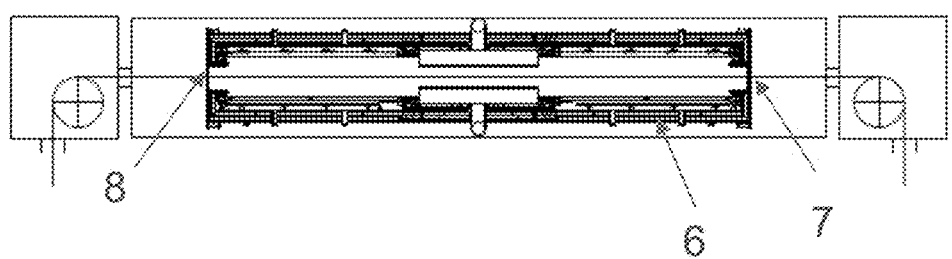
FIG. 5 illustrates a side view of a substrate coated with two vapor ejectors inside a vacuum deposition facility according to the preferred embodiment.

As illustrated in FIG. 5, the vacuum chamber 2 can further comprise a central casing 6. This is a box surrounding the substrate path P on a given length in the running direction, typically 2 to 8 m long in the case of one ejector per side. Its walls delimit a cavity. It comprises two apertures, i.e. a substrate entry 7 and a substrate exit 8 located on two opposite sides of the central casing. Preferably the central casing is a parallelepiped which width is slightly larger than the substrates to be coated.

Preferably, the inner walls of the central casing are suited to be heated at a temperature above the condensation temperature of the metal or metal alloy vapors. The heating may be made by any suitable means, such as for example an induction heater, heating resistors, electron beam. The heating means are suited to heat the inner walls of the central casing at a temperature high enough to avoid condensation of metal or metal alloy vapors on them. Preferably, the walls of the central casing are suited to be heated above the condensation temperatures of the metal elements forming the coating to be deposited, typically above 500° C., for example between 500° C. and 700° C. so as to avoid the condensation of zinc vapors or zinc-magnesium alloy vapors. Thanks to these heating means, the inner walls of the central casing do not become clogged and the facility does not have to be frequently stopped for cleaning. Moreover, the condensation of metal or metal alloys vapors on the inner walls is avoided.

In particular, with the method according to the present invention, it is possible to obtain a metallic substrate coated with at least one metal on both sides of the substrate having an average thickness, wherein the coating is deposited homogenously such that the maximum thickness of the coating can exceed the average thickness of 15% maximum.

In the present invention, the at least one metal is preferably chosen among: zinc, chromium, nickel, titanium, manganese, magnesium, silicon, aluminum or a mixture thereof. Preferably, the metal is zinc with optionally magnesium.

Preferably, the metallic substrate is a steel substrate. Indeed, without willing to be bound by any theory, it is believed that the flatness is further improved when using steel substrate.

The thickness of the coating will preferably be between 0.1 and 20 μm. On one hand, below 0.1 μm, there would be a risk that the corrosion protection of the substrate would be insufficient. On the other hand, it is unnecessary to go beyond 20 μm in order to have the level of corrosion resistance which is required, in particular, in the automotive or construction field. In general, the thickness may be limited to 10 μm for automotive applications.

Finally, the invention relates to a Vacuum deposition facility for the method according to the present invention for continuously depositing, on a running substrate, coatings formed from at least one metal, the facility comprising a vacuum chamber through which the substrate can run along a given path, wherein the vacuum chamber further comprises:

the at least two vapor ejectors facing each other being located on both sides of the substrate and being positioned respectively with an angle $\alpha$ and $\alpha'$, being between the vapor ejector and the axis A perpendicular to the running direction of the substrate, the axis being in the plane of the substrate, $\alpha$ and $\alpha'$ both satisfying the following equation:

$(D1+D2)+Le \sin \alpha + We \cos \alpha = Ws$, and $(D1+D2)+Le \sin \alpha' + We \cos \alpha' = Ws$ $\alpha$ and $\alpha'$ a in absolute value being above 0° and D1 and D2 being the lower distance between ejectors and each substrate edge along the axis (A), Ws being the substrate width, D1 and D2 being above 0 mm and said vapor ejectors having an elongated shape and comprising a slot and being defined by a slot length Le and a slot width We, said vapor ejectors having the same rotation axis.

In a preferred embodiment, the at least two vapor ejectors are mounted to be able to rotate around a feeding pipe linked to a vapor source so that $\alpha$ and $\alpha'$ are adjusted.

EXAMPLES

Tests have been performed on the vacuum deposition facility to assess the efficiency of the method comprising two vapor ejectors ejecting zinc vapor.

Zinc vapor was deposited on both sides of the steel substrate having a width Ws of 1300 mm in the vacuum chamber comprising two vapor ejectors having Le=24 mm and We=1750 mm. For the Trials, D1 and D2 were identical and were fixed to be between −10 mm to +20 mm. −10 mm means that the edges of the vapor extend 10 mm beyond the edges of the substrate. $\alpha$ and $\alpha'$ were calculated for each Trial with the equation according to the present invention. The vacuum pressure was of $10^{-1}$ mBar. The desired thickness of zinc coating was 8 μm corresponding to 100%. The thickness of the metal was measured by X-ray fluorescence spectrometry. The results are in the following Table 1:

The coating of Trials 2 and 3 was homogenously deposited compared to Trial 1.

What is claimed is:

1. A method for continuously depositing, on a running substrate, coatings formed from at least one metal inside a vacuum deposition facility including a vacuum chamber, the method comprising the steps of:

ejecting, in the vacuum chamber, a metallic vapor through at least two vapor ejectors, towards both sides of the running substrate, a layer of at least one metal being formed on each of the both sides by condensation of ejected vapors, the at least two vapor ejectors facing each other being located on the both sides of the substrate and being positioned respectively with an angle $\alpha$ and $\alpha'$ between the respective vapor ejector and a axis perpendicular to a running direction of the running substrate, the axis being in the plane of the substrate, $\alpha$ and $\alpha'$ both satisfying the following equations:

$(D1+D2)+Le \sin \alpha + We \cos \alpha = Ws$ and $(D1+D2)+Le \sin \alpha' + We \cos \alpha' = Ws$ a and a' in absolute value being above 0° and D1 and D2 being defined as a distance between the respective ejector edges and substrate edges along the axis, $W_s$ being the substrate width, D1 and D2 being above 0 mm so the respective ejector edges do not extend beyond the respective substrate edges, the vapor ejectors having an elongated shape and including a slot defined by a slot length Le and a slot width We, the vapor ejectors having a same rotation axis.

2. The method as recited in claim 1 wherein the distances between the ejector and the substrate edges D1 and D2 are above 1 mm.

3. The method as recited in claim 1 wherein the substrate width Ws is maximum of 2200 mm.

4. The method as recited in claim 1 wherein Ws is minimum of 200 mm.

5. The method as recited in claim 1 wherein $\alpha$-$\alpha'$ is less than 10° in absolute terms.

6. The method as recited in claim 1 wherein $\alpha$ is between 5 and 80° in absolute terms.

7. The method as recited in claim 6 wherein $\alpha$ is between 20 and 60° in absolute terms.

8. The method as recited in claim 7 wherein $\alpha$ is between 35 and 55° in absolute terms.

9. The method as recited in claim 1 wherein the slot length Le is between 5 and 50 mm.

10. The method as recited in claim 1 wherein the ejectors have a rectangular shape or a trapezoidal shape.

11. The method as recited in claim 1 wherein D1 is identical to D2.

| Trials | D1 = D2 (mm) | D1 and D2 > 0 mm | $\alpha$ and $\alpha'$ (degrees) | $\alpha$ Satisfies the equation | maximum thickness on both sides (%) | | |
|---|---|---|---|---|---|---|---|
| | | | | | 45 mm from the substrate edges | 30 mm from the substrate edges | 15 mm from the substrate edges |
| 1 | −6 | No | 42.2 | Yes | 130 | 126 | 123 |
| 2* | +27 | Yes | 45.4 | Yes | 110 | 103 | 106 |
| 3* | +40 | Yes | 46.6 | Yes | 102 | 98 | 102 |

*according to the present invention

12. The method as recited in claim 1 wherein the vacuum chamber further comprises a central casing surrounding the substrate, the central casing including a substrate entry and a substrate exit located on two opposite sides of the central casing and at the least two vapor ejectors.

13. The method as recited in claim 12 wherein inner walls of the central casing are suited to be heated at a temperature above a condensation temperature of the metal or metal alloy vapors.

\* \* \* \* \*